United States Patent [19]
Fischer et al.

[11] Patent Number: 5,889,419
[45] Date of Patent: Mar. 30, 1999

[54] DIFFERENTIAL COMPARISON CIRCUIT HAVING IMPROVED COMMON MODE RANGE

[75] Inventors: Jonathan Herman Fischer, Blandon; Bernard Lee Morris, Emmaus, both of Pa.

[73] Assignee: Lucent Technologies Inc., Murray Hill, N.J.

[21] Appl. No.: 740,815

[22] Filed: Nov. 1, 1996

[51] Int. Cl.$^6$ .......................... H03K 5/24; H03K 17/687; H03F 3/45

[52] U.S. Cl. ............................. 327/70; 327/403; 327/99; 327/62; 327/563

[58] Field of Search .............................. 330/295; 327/52, 327/57, 58, 62, 63, 65, 66, 69, 70, 99, 403, 404, 405, 407, 408, 563

[56] References Cited

U.S. PATENT DOCUMENTS

| | | | |
|---|---|---|---|
| 4,585,952 | 4/1986 | Yamamoto | 327/73 |
| 4,912,420 | 3/1990 | Parnell | 327/58 |
| 4,972,157 | 11/1990 | Moyal | 327/408 |
| 5,015,963 | 5/1991 | Sutton | 327/91 |
| 5,142,244 | 8/1992 | Glica et al. | 327/65 |
| 5,194,824 | 3/1993 | Wu et al. | 330/295 |
| 5,208,552 | 5/1993 | Ryat | 330/255 |
| 5,222,011 | 6/1993 | Braun | 361/154 |
| 5,539,340 | 7/1996 | Van Leeuwen et al. | 327/63 |
| 5,701,331 | 12/1997 | Hunt | 327/333 |

Primary Examiner—Timothy P. Callahan
Assistant Examiner—Terry L. Englund
Attorney, Agent, or Firm—James H. Fox

[57] ABSTRACT

A differential comparison circuit obtains an improved common mode range with respect to the voltages on first and second inputs. A first comparator is activated when the first and second input voltages are above a first level. A second comparator is activated when the first and second input voltages are below a second level. The output of the comparator that is activated is selected for providing the comparison output signal. In this manner, the comparator having improved performance, typically in terms of differential input voltage sensitivity, may be selected for the voltages present at the inputs. In a typical embodiment, the first comparator uses n-channel input devices, and the second comparator uses p-channel input devices. The activation is provided by voltage level-sensing circuitry, and may include hysteresis to help ensure reliable operation.

11 Claims, 2 Drawing Sheets

DIFFERENTIAL COMPARISON CIRCUIT HAVING IMPROVED COMMON MODE RANGE

BACKGROUND OF THE INVENTION

Description of the Prior Art

Differential comparators are well known in the integrated circuit (IC) art for providing an output signal that depends on the relative levels of the inputs signals. For example, referring to comparator 10 in FIG. 1, when the voltage on the first (non-inverting) input 11 is higher than the voltage on the second (inverting) input 12, the comparator output 13 is high. Alternatively, when the voltage on the first input is less than the voltage on the second input, the comparator output is low.

The difference between the voltages on the first and second inputs is referred to as the "differential input voltage" (AV). One figure of merit of a differential comparator is how large the differential input voltage must be in order to cause the output voltage to change from high to low, or vice-versa. Another figure of merit is referred to as the "Common Mode Range" (CMR), which is the voltage range over which a small differential input signal can be detected. Most differential comparators have a rather limited CMR as compared to the full power supply voltage range, often referred to as the "rail-to-rail" voltage range. Typically, a comparator with p-channel field effect transistor input devices has a CMR from the negative power supply voltages $V_{SS}$ (0 volts) to about $V_{DD}$-1.5 volts. A comparator with n-channel field effect transistor input devices has a CMR from about 1.5 volts to $V_{DD}$.

However, several applications exist where a relatively larger CMR is necessary. For example, the Universal Serial Bus (USB) specification requires a receiver with a rail-to-rail Common Mode Range. The Low Voltage Differential Signal (LVDS) specification also requires a receiver with a very wide range, too wide for typical prior-art comparators to meet. One design that achieves a relatively large CMR range is given in the *IEEE Journal of Solid-State Circuits*, Vol 30, February 1995, pp. 156–159. However, that design is relatively complicated and requires a large amount of integrated circuit (IC) chip area, being more similar in many respects to an operational amplifier than to a comparator.

SUMMARY OF THE INVENTION

We have invented a differential comparison technique and circuit having improved common mode range. A first comparator is activated when first and second input signals are above a given level. A second comparator is activated when the first and second input signals are below a given level. The output of the comparator that is activated is selected for providing a comparison output signal.

DETAILED DESCRIPTION

Figure 1:
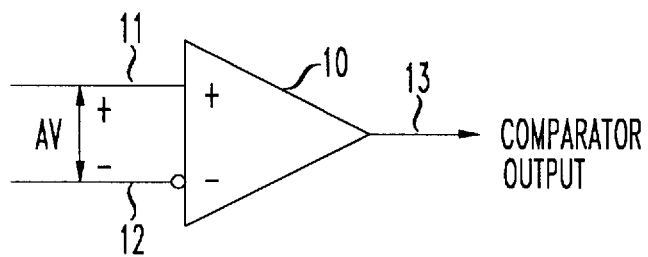
FIG. 1 illustrates a prior-art comparator.

The following detailed description relates to a technique and circuitry for performing differential comparison that provides for an improved common mode range. Although voltage comparators are shown in the illustrative embodiment, current comparators may benefit from use with the inventive technique, and are included herein. In the illustrative embodiment shown in FIG. 2, two standard comparators 201, 202 are connected to level-sensing circuitry. The first comparator 201 (COMPN) is implemented using n-channel input devices, whereas the second comparator 202 (COMPP) is implemented using p-channel input devices. The comparator inputs P and N are connected in parallel via lines 209, 210 respectively, with P being an non-inverting input and N being an inverting input. Their outputs, ZN and ZP on nodes 211, 212 respectively, go through a simple multiplexer comprising pass transistors M1, M2, M3 and M4. Which of these outputs (ZN or ZP) is selected by the multiplexer to go through to the comparator output node 213 depends on the voltage levels of the Y and YN control signals, which in turn depends on the absolute levels of the inputs (P and N). The absolute level may be considered the magnitude of the input voltage with respect to a power supply voltage, being $V_{SS}$ (ground or zero volts) in the illustrative case.

Figure 2:
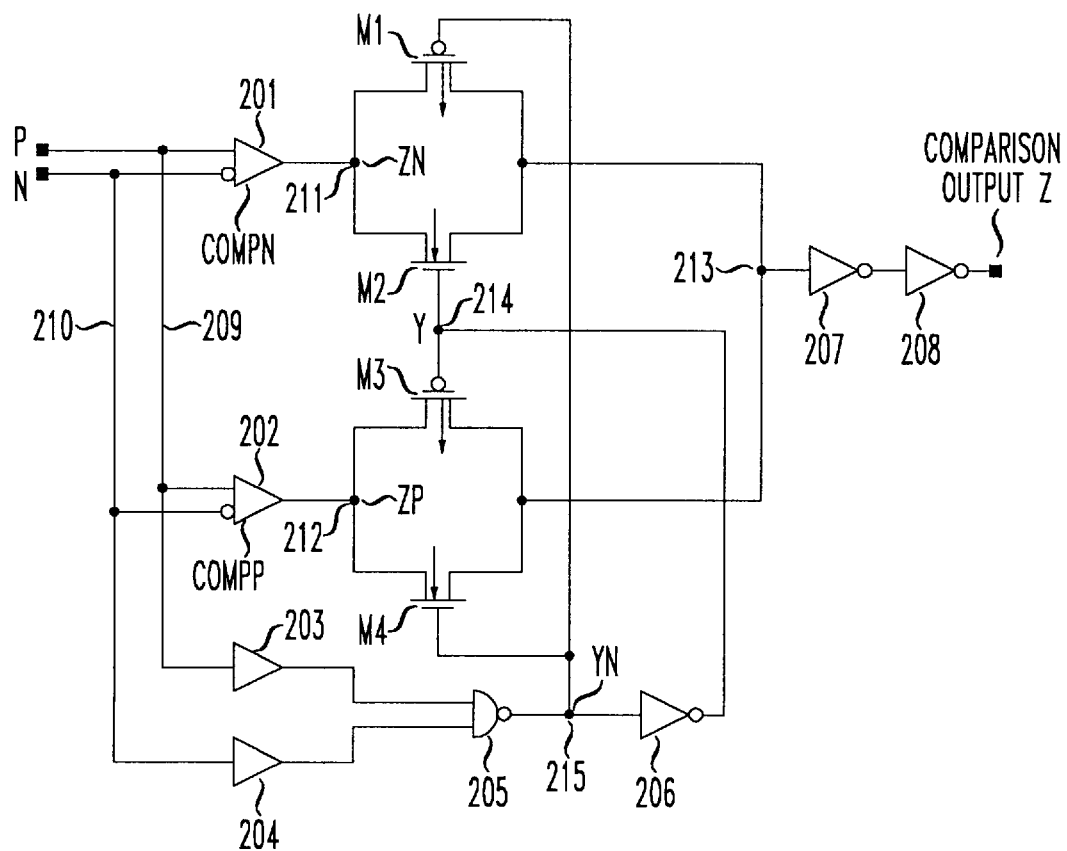
FIG. 2 illustrates a first embodiment of the inventive technique.

The magnitude range of the input voltages (e.g., high or low) is determined by input buffers 203 and 204 shown in FIG. 2. These buffers may be simple non-inverting buffers, but hysteresis in these buffers is advisable, in order to help ensure reliable operation. Therefore, in a typical implementation, buffers 203 and 204 may be Schmitt Trigger input buffers, according to various designs known in the art. When signals P and N are both above the Schmitt Trigger threshold (typically 1.5 to 2 volts), voltage Y on node 214 is high and YN on node 215 is low. This state turns on transistors M1 and M2 and turns off M3 and M4, causing the n-channel comparator's output ZN to appear at comparison output node 213. This node connects to the input of inverter 207, which drives inverter 208 to produce an output signal Z. Since COMPN has a CMR from about 1.5 volts up to $V_{DD}$, its output will be valid throughout this range. If either of the levels P or N fall below the Schmitt threshold the multiplexer will switch so that the P-channel's output ZP goes to comparison output node 213. COMPP has a CMR that typically goes from 0 to about $V_{DD}$-1.5 volts, so its output will be valid over this range. In practice, there is usually a considerable amount of overlap of the ranges wherein the CMRs of the two comparators are within acceptable values. Therefore, the exact switching threshold of the Schmitt triggers is usually not very critical.

Figure 3:
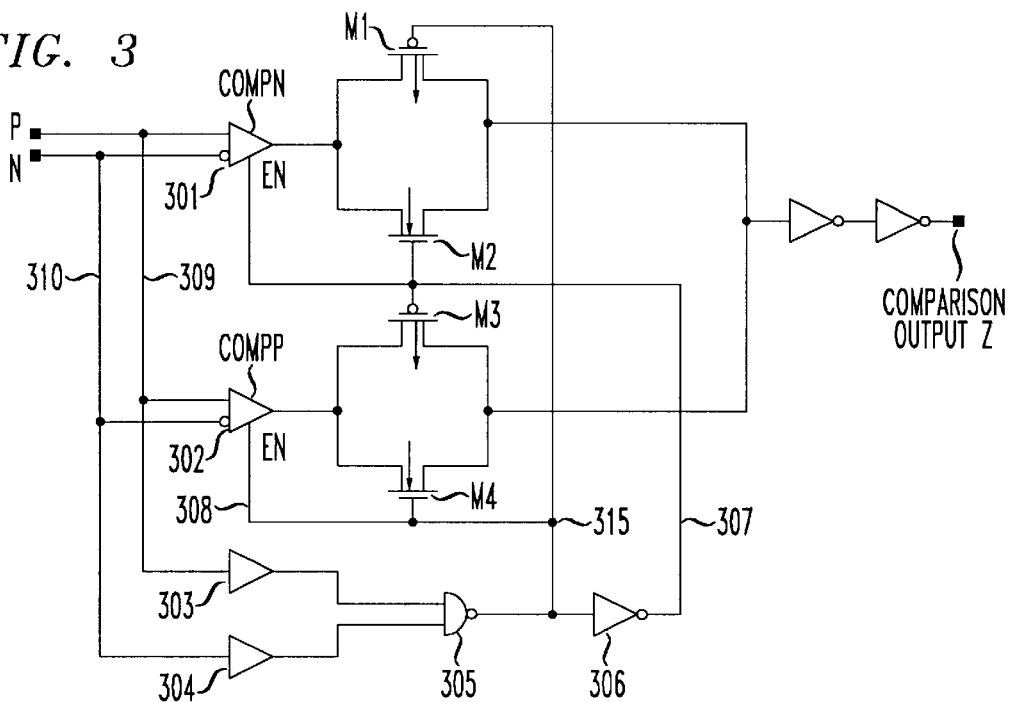
FIG. 3 illustrates a second embodiment of the inventive technique.

The circuit of FIG. 2 may be modified to lower the DC power consumption, by disabling the comparator whose output is not selected to be the comparison output. This may by accomplished by adding a disable circuit to both comparators, so as to provide comparators 301, 302 as shown in FIG. 3. The disable input EN of each comparator may be provided according to techniques known in the art for turning off DC current to the comparators. For example, when the enable input EN to these comparators is high, they behave normally, and consume DC power. When the enable input to a given comparator is low, that comparator is powered down, and does not consume significant DC power. The enable signal to the COMPN comparator is carried on line 307 from the output of inverter 306, whereas the enable signal to the COMPP comparator is carried on line 308 from the output of NAND gate 305. These outputs are controlled by the input signals P and N applied to buffers 303 and 304 as noted above. Hence, it can be seen that in the embodiment shown in FIG. 3, the same signals that are used to select which comparator (COMPN or COMPP) is to be the active comparator are also used to power down the comparator that is not selected.

Figure 4:
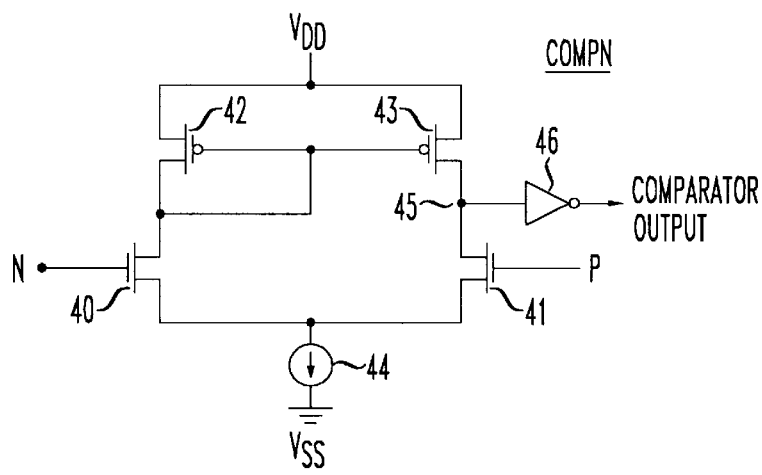
FIG. 4 illustrates a typical comparator with n-channel input devices.
Figure 5:
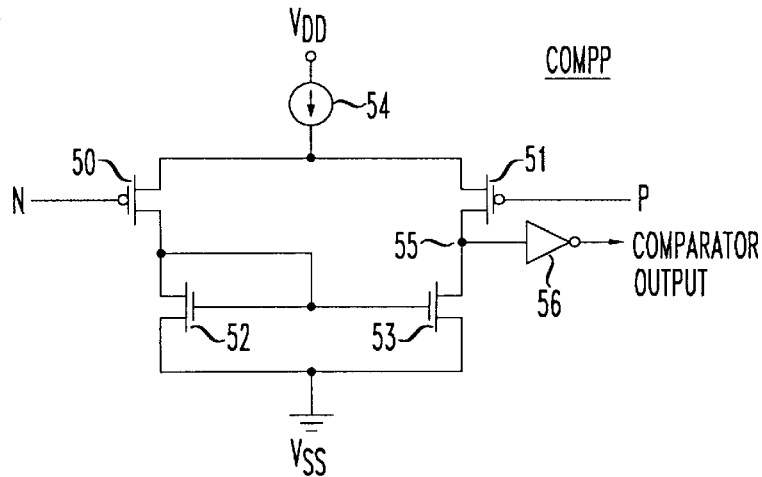
FIG. 5 illustrates a typical comparator with p-channel input devices.

The above embodiment has shown comparators optimized with regard to differential input voltage sensitivity over a given portion of the rail-to-rail range. However, other performance characteristics (speed, noise level, etc.) may be used as the basis for comparator selection. Furthermore, the magnitude of the input levels need not extend from rail-to-rail (e.g., $V_{SS}$ to $V_{DD}$) in some applications. Although the comparators may be of any suitable design for the desired application, a typical comparator having n-channel input field effect transistors (40, 41) is shown in FIG. 4. A typical comparator having p-channel input field effect transistors (50, 51) is shown in FIG. 5. The comparators may be implemented in technologies other than the CMOS technology illustrated; for example, bipolar integrated circuit technology or BICMOS (i.e., bipolar and CMOS) technology. In those cases, bipolar NPN transistors may be used in lieu of the n-channel input field effect transistors, and bipolar PNP transistors may be used in lieu of the p-channel input field effect transistors illustrated. Furthermore, the means for selecting the output of a given comparator may be other than the pass transistors shown. For example, multiplexers using NAND gates or various other types of logic gates may be used.

Whereas two comparators are shown in the above illustrative embodiment, the inventive technique may be implemented with three or more comparators, each activated over a different range of signal levels. In that manner, relatively larger signal level ranges may be covered for a given desired performance level than with typical prior-art techniques. The comparators are typically implemented on a single integrated circuit. The inputs to the comparators may then connect to signal sources that originate on that integrated circuit, or may connect to signal sources external to the integrated circuit. Similarly, the comparison output may be supplied to circuitry on the integrated circuit, or may be supplied externally.

The invention claimed is:

1. An integrated circuit having a differential comparison circuit for comparing a first signal to a second signal, and for providing a comparison output signal;

characterized in that said comparison circuit comprises a first comparator having an inverting input coupled to receive said first signal, a non-inverting input coupled to receive said second signal, and an output; a second comparator having an inverting input coupled to receive said first signal, a non-inverting input coupled to receive said second signal, and an output; and a selection circuit responsive to the magnitudes of said first and second signals for selecting either said first comparator or said second comparator to provide said comparison output signal, and with said integrated circuit further having a disable circuit for disabling the first or second comparator when it is not selected by said selection circuit.

2. The integrated circuit of claim 1 wherein said selection circuit comprises pass transistors coupled to the output of said first comparator and the output of said second comparator for providing said comparison output signal.

3. The integrated circuit of claim 1 wherein said first comparator includes n-channel field effect input transistors coupled to receive the first and second signals; said second comparator includes p-channel field effect input transistors coupled to receive the first and second signals; and wherein said selection circuit selects said first comparator when the magnitudes of the first and second signals are more positive than a first magnitude, and said selection circuit selects said second comparator when the magnitudes of the first and second signals are less positive than a second magnitude.

4. The integrated circuit of claim 1 wherein said first comparator and said second comparator are voltage comparators.

5. The integrated circuit of claim 1 wherein said first comparator and said second comparator are current comparators.

6. An integrated circuit having a differential comparison circuit for comparing a first voltage to a second voltage, and for providing a comparison output signal;

characterized in that said comparison circuit comprises a first comparator having an inverting input and a non-inverting input each coupled to n-channel field effect input transistors that receive said first voltage and second voltage, respectively, and an output; a second comparator having an inverting input and a non-inverting input each coupled to p-channel field effect input transistors that receive said first voltage and second voltage, respectively, and an output;

and further comprising a selection circuit responsive to the magnitudes of the voltages at the comparator inputs for selecting either said first comparator or said second comparator to provide said comparison output signal, and with said integrated circuit further having a disable circuit to disable the first or second comparator when it is not selected by said selection circuit.

7. The integrated circuit of claim 6 wherein said selection circuit comprises pass transistors coupled to the output of said first comparator and the output of said second comparator for providing said comparison output signal.

8. A method for comparing the difference between the magnitude of a first signal and the magnitude of a second signal, and for providing a comparison output signal;

characterized by comparing said difference in first and second comparators, with each comparator being optimized for performing the comparison over first and second signal magnitude ranges, and selecting either the first comparator or the second comparator for providing said comparison output signal depending on a relationship of a given level to the first and second signal magnitudes, and further comprising the step of disabling the first or second comparator when it is not selected.

9. The integrated circuit of claim 8 wherein said first and second signal magnitudes are voltages.

10. The integrated circuit of claim 8 wherein said first and second signal magnitudes are currents.

11. The method of claim 8 wherein said first comparator has inputs coupled to n-channel field effect input transistors, said second comparator has inputs coupled to p-channel field effect input transistors, and said first comparator is selected when the magnitudes of the first and second signals are more positive than the given level, and said second comparator is selected when the magnitude of either the first of the second signal is less positive than the given level.

* * * * *